(12) United States Patent
Forrester et al.

(10) Patent No.: US 8,498,369 B2
(45) Date of Patent: Jul. 30, 2013

(54) ADAPTIVE DIGITAL POST DISTORTION REDUCTION

(75) Inventors: Aracely W. Forrester, San Diego, CA (US); Roberto Rimini, San Diego, CA (US); Peter D. Heidmann, San Diego, CA (US); Joseph P. Burke, San Diego, CA (US); Paul J. Drexler, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 466 days.

(21) Appl. No.: 12/609,776

(22) Filed: Oct. 30, 2009

(65) Prior Publication Data

US 2011/0103455 A1  May 5, 2011

(51) Int. Cl.
*H04L 27/01* (2006.01)
(52) U.S. Cl.
USPC ............. 375/350; 375/232; 375/346
(58) Field of Classification Search
USPC .......................... 375/350, 232, 346
See application file for complete search history.

(56) References Cited

U.S. PATENT DOCUMENTS

| | | | |
|---|---|---|---|
| 7,242,725 B2 | 7/2007 | Matsumoto et al. | |
| 2002/0060827 A1* | 5/2002 | Agazzi | 359/161 |
| 2003/0016741 A1 | 1/2003 | Sasson et al. | |
| 2006/0223558 A1* | 10/2006 | Behzad | 455/502 |
| 2008/0187035 A1 | 8/2008 | Nakamura et al. | |
| 2009/0051458 A1* | 2/2009 | Miller et al. | 333/18 |
| 2009/0094304 A1 | 4/2009 | Batruni | |
| 2009/0316826 A1* | 12/2009 | Koren et al. | 375/296 |

FOREIGN PATENT DOCUMENTS

| | | |
|---|---|---|
| JP | 2008098781 A | 4/2008 |
| WO | WO0103287 A1 | 1/2001 |

OTHER PUBLICATIONS

International Search Report and Written Opinion—PCT/US2010/054847, International Search Authority—European Patent Office—Apr. 4, 2011.
Moffatt J P, et al., "An adaptive QAM linearizer using data postdistortion", 19891127; 19891127—19891130, Nov. 27, 1989, pp. 406-412, XP010083855.
Aparin et al., "An Integrated LMS Adaptive Filter of TX Leakage for CDMA Receiver Front Ends", IEEE Journal of Solid-State Circuits, vol. 41, No. 5, pp. 1171-1182, May 2006.
Zhu et al., "Open-Loop Digital Predistortion for RF Power Amplifiers Using Dynamic Deviation Reduced-Based Volterra Series", IEEE Transactions on Microwave Theory and Techniques, vol. 56, No. 7, pp. 1524-1534, Jul. 2008.
Schetzen, M., "The Volterra and Wiener Theories of Nonlinear Systems", Krieger Publishing Company, pp. 136-141, Malabar, Florida, 2006.
Harker et al., "Dynamic Range Improvements and Measurements in Radar Systems", IET Radar Sonar Navig., vol. 1, No. 6, pp. 398-406, Dec. 2007.

(Continued)

*Primary Examiner* — Kenneth Lam
*Assistant Examiner* — Michael Neff
(74) *Attorney, Agent, or Firm* — Kevin T. Cheatham (57) ABSTRACT

A method for adaptive digital post distortion reduction is described. An analog radio frequency (RF) signal is received. The frequency of the analog RF signal is downconverted using analog circuitry. The analog RF signal is converted to a digital signal using an analog to digital converter (ADC). Digital post distortion reduction is applied to the digital signal to reduce nonlinearities in the digital signal.

33 Claims, 9 Drawing Sheets

OTHER PUBLICATIONS

Nesimoglu et al., "A Novel Mixer Linearisation Technique Using Frequency Retranslation", Centre for Communications Research, University of Bristol, 2002.

Quach et al., "A Postdistortion Receiver for Mobile Communications", IEEE Transactions on Vehicular Technology, vol. 42, No. 4, pp. 604-616, Nov. 1993.

Batruni et al., "Digitally Assisted Analog: Reducing Design Constraints Using Nonlinear Digital Signal Processing", Oct. 27, 2009.

Kim et al., "A Cellular-Band CDMA 0.25-µm CMOS LNA Linearized Using Active Post-Distortion", IEEE Journal of Solid-State Circuits, vol. 41, No. 7, pp. 1530-1534, Jul. 2006.

* cited by examiner

ADAPTIVE DIGITAL POST DISTORTION REDUCTION

TECHNICAL FIELD

The present disclosure relates generally to communication systems. More specifically, the present disclosure relates to systems and methods for adaptive digital post distortion reduction.

BACKGROUND

Wireless communication systems are widely deployed to provide various types of communication content such as voice, video, data, and so on. These systems may be multiple-access systems capable of supporting simultaneous communication of multiple terminals with one or more base stations.

Nonlinear distortion and memory effects in wireless device receivers may cause interference that directly impacts the performance of a receiver. To account for this distortion, complex commercial wireless transceivers have been designed. These transceivers may use additional analog circuitry along with analog signal processing to limit the effects of the distortion products. Such analog circuitry may use higher direct current (DC) power circuit designs. Distortion products may limit the receiver sensitivity and signal-to-noise ratio (SNR) caused by self-jamming and cross modulation.

As the radio frequency (RF) environment continues to become more harsh, receivers may require a higher dynamic range to function. Using conventional solutions, a higher dynamic range typically equates to a higher receiver power consumption. As process nodes decrease, voltages may also reduce, compounding the problem even in existing RF scenarios. Benefits may be realized by increasing receiver dynamic range.

SUMMARY

A method for adaptive digital post distortion reduction is disclosed. An analog radio frequency (RF) signal is received. The frequency of the analog RF signal is downconverted using analog circuitry. The analog RF signal is converted to a digital signal using an analog to digital converter (ADC). Digital post distortion reduction is applied to the digital signal to reduce nonlinearities in the digital signal.

Applying digital post distortion reduction may be accomplished using dedicated specific hardware. Applying digital post distortion reduction may also be accomplished using a digital signal processor (DSP). The analog signal may be amplified using a low noise amplifier (LNA). Applying digital post distortion reduction may be performed prior to demodulating the digital signal. Applying digital post distortion reduction may include applying a nonlinear equalizer to the digital signal.

The nonlinear equalizer may be based on an adaptive Volterra filter or polynomial expansion. An output of the nonlinear equalizer may be input to a modem that demodulates, decodes and estimates information bits of the digital signal. The equalizer may be trained. Training the nonlinear equalizer may include applying the nonlinear equalizer to the digital signal to generate a transformation signal. The nonlinear equalizer may use a set of weights. The transformation signal may be subtracted from a reference signal passed by a multiplexer to obtain an error signal. The training process may iteratively repeat until a convergence is achieved using the minimum mean square error of the error signal as a cost function.

The multiplexer may operate to reduce cross modulation distortion. The reference signal may be a composite signal including a transmit signal (Tx) and an estimated jammer. The multiplexer may also operate to reduce single receive signal (Rx) signal distortion. The reference signal may include pilot symbols. The multiplexer may operate in either a first mode or a second mode. The multiplexer may switch between the first mode and the second mode based on a jammer detector. The multiplexer may switch between the first mode and the second mode based on a transmit signal (Tx) power level. The set of weights may be adjusted when a new pilot arrives.

A wireless device configured for adaptive digital post distortion reduction is described. The wireless device includes circuitry configured to receive an analog radio frequency (RF) signal. The wireless device also includes circuitry to downconvert the frequency of the analog RF signal. The wireless device further includes circuitry to convert the analog RF signal to a digital signal. The wireless device also includes circuitry to apply digital post distortion reduction to the digital signal to reduce nonlinearities in the digital signal.

The analog RF signal may be amplified using a low noise amplifier (LNA). The frequency of the analog RF signal may be downconverted using a mixer. The analog RF signal may be converted to a digital signal using an analog to digital converter (ADC).

A wireless device configured for adaptive digital post distortion reduction is described. The wireless device includes means for receiving an analog radio frequency (RF) signal. The wireless device also includes means for downconverting the frequency of the analog RF signal using analog circuitry. The wireless device further includes means for converting the analog RF signal to a digital signal using an analog to digital converter (ADC). The wireless device also includes means for applying digital post distortion reduction to the digital signal to reduce nonlinearities in the digital signal.

A computer-readable medium encoded with computer-executable instructions is also described. Execution of the computer-executable instructions is for receiving an analog radio frequency (RF) signal. Execution of the computer-executable instructions is also for downconverting the frequency of the analog RF signal using analog circuitry. Execution of the computer-executable instructions is further for converting the analog RF signal to a digital signal using an analog to digital converter (ADC). Execution of the computer-executable instructions is also for applying digital post distortion reduction to the digital signal to reduce nonlinearities in the digital signal.

DETAILED DESCRIPTION

As mentioned above, as the radio frequency (RF) environment continues to become more harsh, receivers may require a higher dynamic range to function. Using conventional solutions, a higher dynamic range typically equates to a higher receiver power consumption. As process nodes decrease, voltages may also reduce, compounding the problem even in existing RF scenarios. A digital post distortion scheme may alleviate the high linearity requirements and thus reduce the high power consumption of a wireless transceiver.

Figure 1:
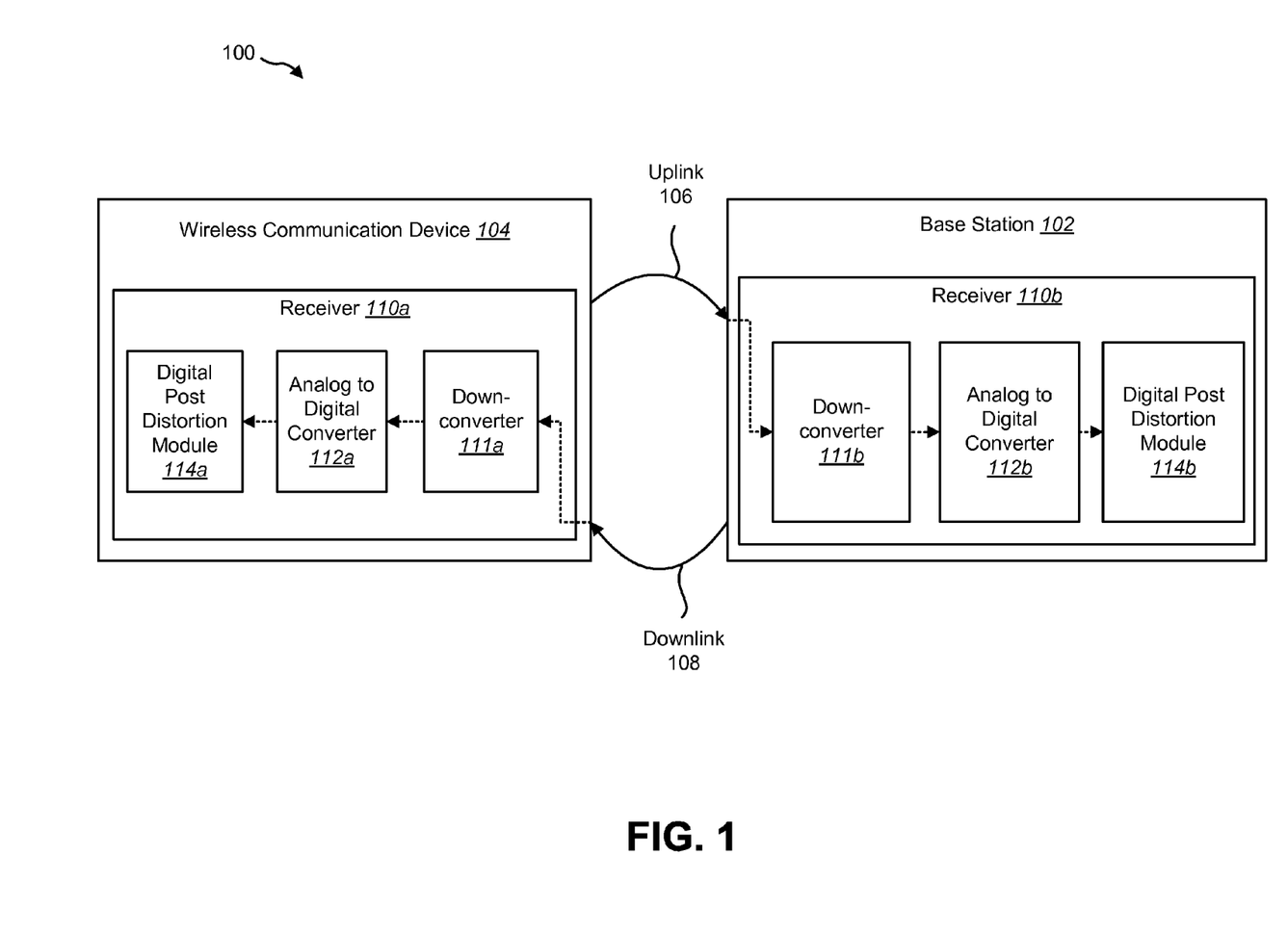
FIG. 1 shows a wireless communication system with multiple wireless devices.

FIG. 1 shows a wireless communication system 100 with multiple wireless devices. A wireless device may be a wireless communication device 104 or a base station 102. A base station 102 is a station that communicates with one or more wireless communication devices 104. A base station 102 may also be referred to as, and may include some or all of the functionality of, an access point, a broadcast transmitter, a Node B, an evolved Node B, etc. Each base station 102 provides communication coverage for a particular geographic area. The term "cell" can refer to a base station 102 and/or its coverage area depending on the context in which the term is used.

A wireless communication device 104 may also be referred to as, and may include some or all of the functionality of, a terminal, an access terminal, a user equipment (UE), a subscriber unit, a station, etc. A wireless communication device 104 may be a cellular phone, a personal digital assistant (PDA), a wireless device, a wireless modem, a handheld device, a laptop computer, etc. A wireless communication device 104 may communicate with zero, one, or multiple base stations 102 on the downlink (DL) 108 and/or uplink (UL) 106 at any given moment. The downlink 108 (or forward link) refers to the communication link from a base station 102 to the wireless communication device 104, and the uplink 106 (or reverse link) refers to the communication link from the wireless communication device 104 to the base station 102.

Wireless communication systems 100 may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, orthogonal frequency division multiple access (OFDMA) systems, and spatial division multiple access (SDMA) systems.

The wireless communication device 104 may receive signals on the downlink 108. The signals received by the wireless communication device 104 may then be processed by a receiver 110*a* as part of a receive signal (Rx) chain. The receiver 110*a* may include analog RF circuitry for down conversion 111*a* followed by an analog to digital converter (ADC) 112*a*. The analog to digital converter 112*a* may convert the signals received on the downlink 108 from analog signals to digital signals. The receiver 110*a* may also include a digital post distortion module 114*a*. The digital post distortion module 114*a* is discussed in further detail below in relation to FIG. 5. The digital post distortion module 114*a* may use digital signal processing (DSP) to reduce distortion from the digital signal.

The base station 102 may receive signals on the uplink 106. The signals received by the base station 102 may then be processed by a receiver 110*b* as part of an Rx chain. The receiver 110*b* may include a downconverter 111*b*. The downconverter 111 may downconvert the received analog signals to the proper frequency. The receiver 110*b* may also include an analog to digital converter 112*b* that converts the received analog signals to digital signals. The receiver 110*b* may further include a digital post distortion module 114*b*. The digital post distortion module 114*b* may use digital signal processing to reduce distortion from the digital signals.

As complementary metal-oxide-semiconductor (CMOS) processes continue to shrink, lower voltage supplies may be used within the wireless communication device 104 and/or the base station 102. The use of lower voltage supplies may lead to increased distortion. Alternatively, to maintain similar SNR levels, the use of lower voltage supplies may lead to increased power. A digital post distortion module 114 may improve the SNR and carrier-to-noise ratio (C/N) for a receiver 110 while consuming less DC power. Digital post distortion reduction may also improve receiver distortion under jammer conditions such as cross-modulation. In cross modulation, a strong signal may be transferred onto other signals being received.

In a Long Term Evolution (LTE) wireless communication system, the downlink 108 may use OFDM modulation. OFDM may have a large peak-to-average ratio (PAR) and be particularly sensitive to nonlinearity. Inter-modulation (IM) products may generate inter-carrier interference (ICI) which destroys the orthogonality of OFDM sub-carriers. Examples of IM products include $2n^d$ order IM (IM2) and $3^{rd}$ order IM (IM3). For example, in LTE, the baseband (BB) downconversion caused by IM2 of a transmit signal (Tx) leaked through the duplexer may fall on the Primary synchronization channel, Secondary synchronization channel (PSC-SSC). Digital post distortion reduction may be beneficial to several minimum performance specification (MPS) tests for third generation cellular systems (3G) (i.e. wideband code division multiple access (WCDMA)) and fourth generation cellular systems (4G) (i.e. LTE) which require high linearity.

For example, digital post distortion reduction may provide benefits for the Maximum Input Level MPS, where the terminal is required to demodulate a full bandwidth signal at −25 dBm (power ratio in dB of the measured power referenced to one milliwatt (mW)) power at the antenna port while the transmitter is simultaneously set at a maximum power of −4 dB. Digital post distortion reduction may reduce the IM2 distortion effect in the Maximum Input Level MPS. As another example, digital post distortion reduction may provide benefits for Narrow Band Blocking MPS, where the terminal is required to demodulate a desired signal in its assigned channel bandwidth in the presence of strong interfering signals in adjacent channels. Digital post distortion reduction may reduce the cross modulation distortion in Narrow Band Blocking.

The use of digital post distortion reduction may lower the IM2/IM3 products, increase the Spurious-Free Dynamic Range (SFDR) and effective number of bits (ENOB) of an ADC 112, and lower the DC power. Furthermore, linearization of an analog receiver has the ability to allow coexistence of different radios with high power imbalance or to enable implementation of alternative technologies with pronounced non-linear behavior such as discrete time front-end devices.

Figure 2:
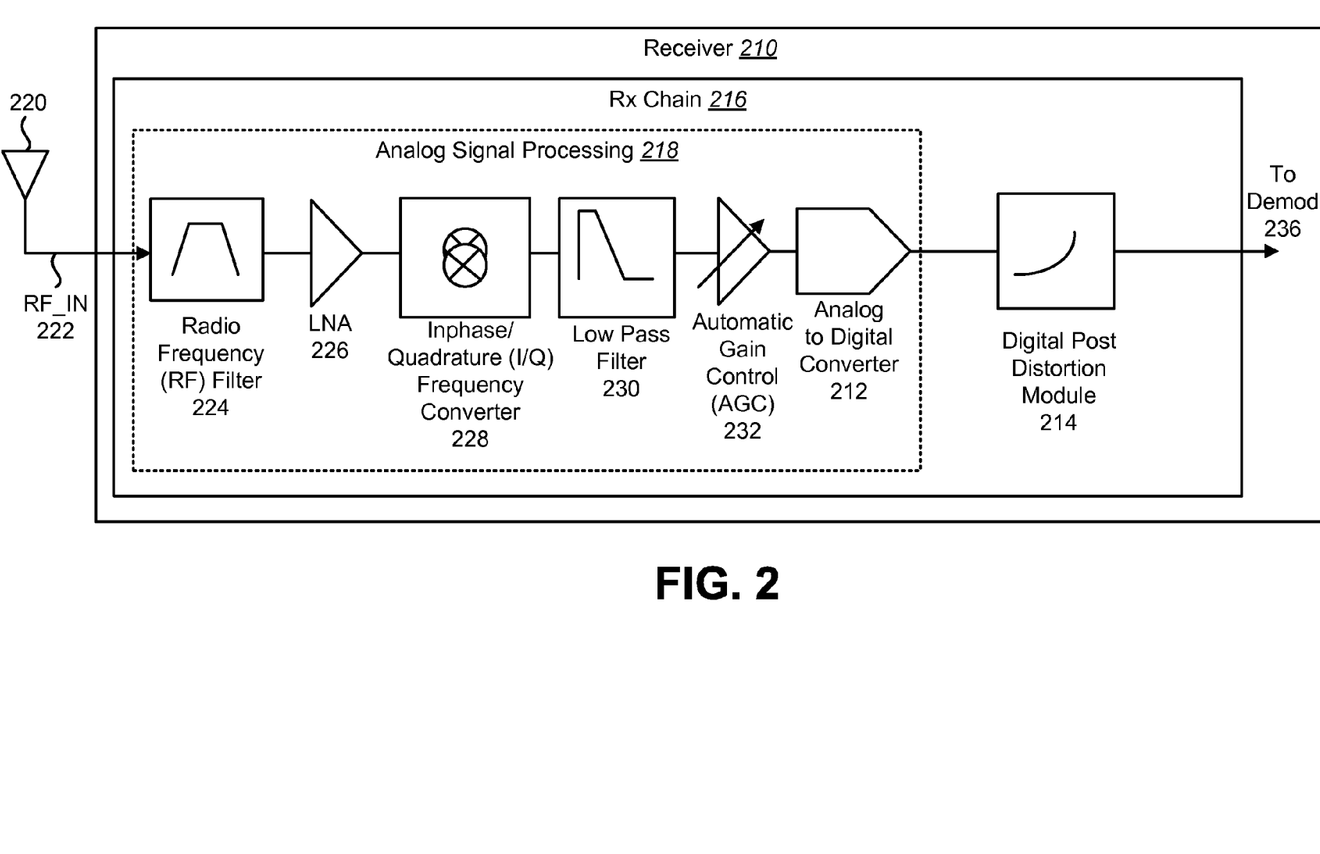
FIG. 2 illustrates a receiver for use in the present systems and methods.

FIG. 2 illustrates a receiver 210 for use in the present systems and methods. The receiver 210 may be part of a wireless device such as a base station 102 or a wireless communication device 104. An analog RF signal RF_IN 222 may be received via an antenna 220 on the wireless device. The receiver 210 may include an Rx chain 216. As part of the Rx chain 216, analog signal processing 218 may be performed on the analog signal. RF_IN 222 may be filtered using an RF filter 224 and amplified using an LNA 226. The frequency of the analog signal may be changed using inphase/quadrature (I/Q) mixers 228. The frequency converted signal may then be filtered using a low pass filter 230. The filtered signal may be amplified using automatic gain control (AGC) 232. The signal may then be converted from an analog signal to a digital signal using an ADC 212. The digital post distortion used in the present systems and methods may be used in either zero intermediate frequency (IF) or superheterodyne architectures.

Once the analog signal processing 218 is completed (i.e. once the analog signal has been converted to a digital signal by the analog to digital converter 212), the digital signal may be input into a digital post distortion module 214. The digital post distortion module 214 may reduce distortion in the digital signal by attempting to linearize the digital signal. The digital post distortion module may use digital signal processing (DSP) to linearize the receiver 210.

Nonlinear distortion in the receiver 210 may cause interference that directly impacts receiver 210 design and performance. The distortion may limit the receive sensitivity and SNR of the wireless device via: self-jamming, phase noise, cross-modulation, and analog to digital converter Spurious-Free Dynamic Range (SFDR). This may lead to more complex and higher direct current (DC) power designs.

Using digital post distortion reduction may allow for the design of the receiver 210 to use less ideal circuits, lower power, and smaller size design methods in the analog signal processing. Thus, the receiver 210 may be built using less expensive components and design. When linearization is not required, the digital post distortion module 214 may be bypassed. As CMOS processes continue to shrink, lower voltage supplies may lead to increased distortion to maintain similar SNR levels (or increased power). The use of a digital post distortion module 214 may allow the analog signal processing 218 to incur analog distortion. The analog distortion may then be reduced after the ADC 212 using the digital post distortion module 214. The output 236 of the digital post distortion module 214 may then be sent to a demodulator.

Figure 3:
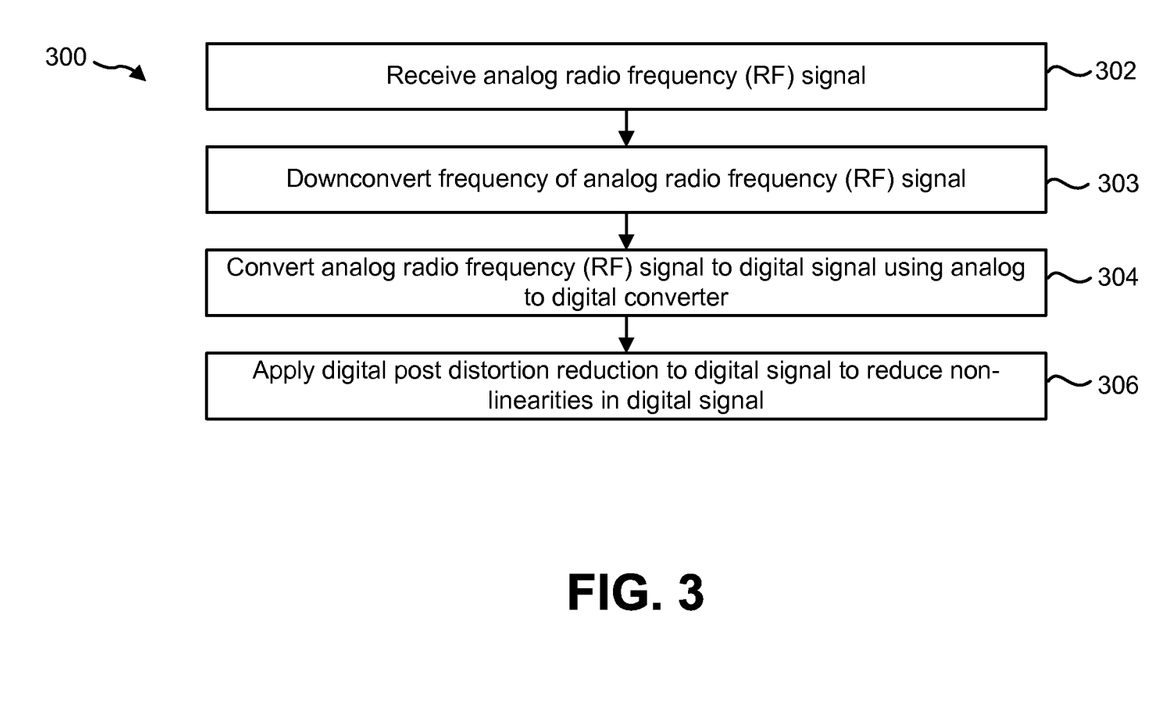
FIG. 3 is a flow diagram of a method for receiver linearization using adaptive processing.

FIG. 3 is a flow diagram of a method 300 for receiver 110 linearization using adaptive processing. The method 300 may be performed by a wireless device. For example, the method 300 may be performed by a wireless communication device 104 or a base station 102. The wireless device may receive 302 an analog RF signal. The analog RF signal may be received by an antenna 220 on the wireless device. The wireless device may downconvert 303 the frequency of the analog RF signal. In one configuration, the wireless device may downconvert 303 using analog circuitry. The wireless device may next convert 304 the analog RF signal to a digital signal using an analog to digital converter 112. The wireless device may then apply 306 digital post distortion reduction to the digital signal to reduce nonlinearities in the digital signal. The digital post distortion reduction may be adaptive. For example, the digital post distortion reduction may be based on a nonlinear model. The nonlinear model may be updated using the Rx waveform pilot which allows linearization from the LNA 226 to the ADC 212 output.

Figure 4:
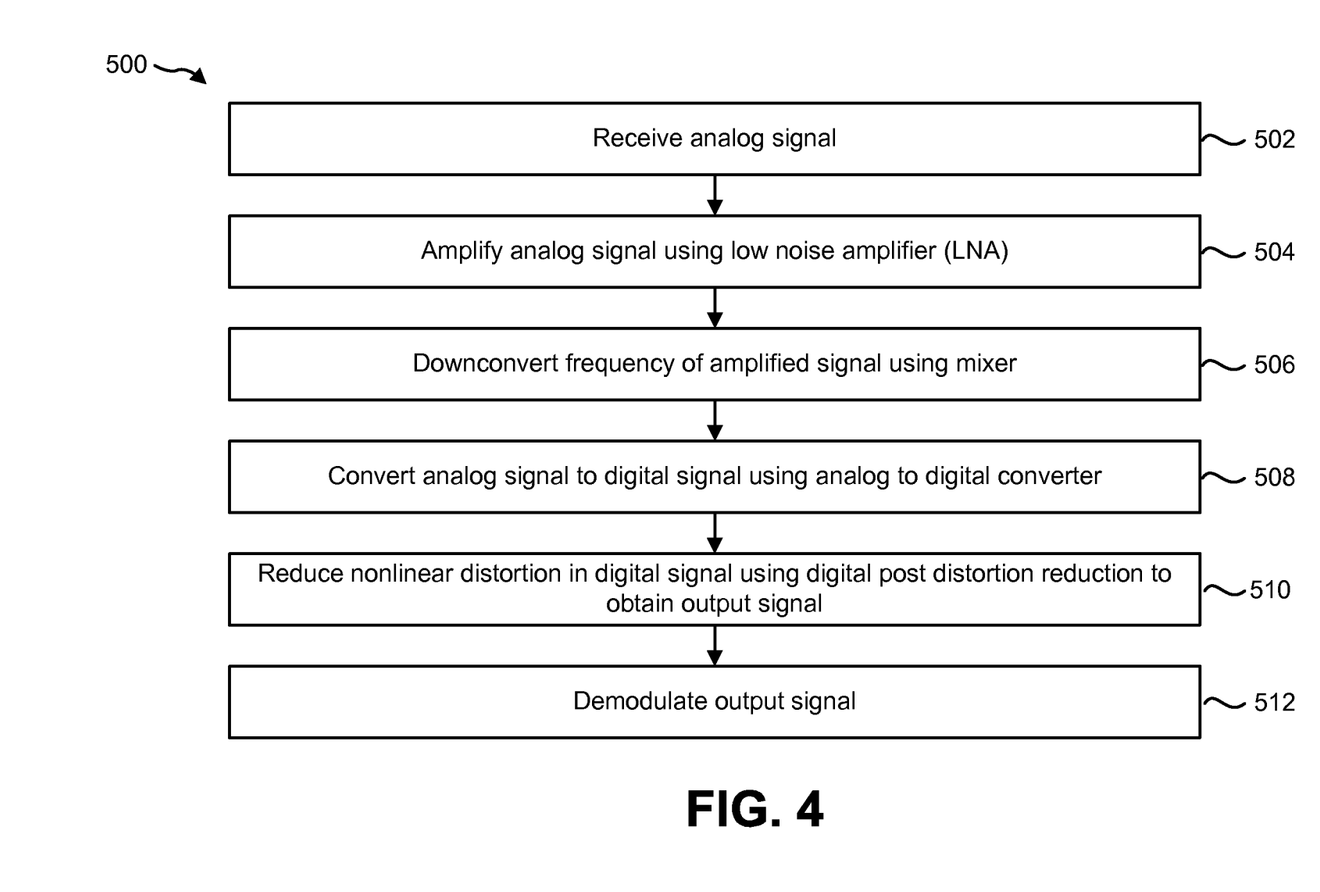
FIG. 4 is a flow diagram of another method for receiver linearization using adaptive processing.

FIG. 4 is a flow diagram of another method 500 for receiver 110 linearization using adaptive processing. The method 500 may be performed by a wireless device. The wireless device may receive 502 an analog signal. The analog signal may be an RF signal received by an antenna 220 on the wireless device. The wireless device may amplify 504 the analog signal using a low noise amplifier (LNA) 226. The wireless device may next downconvert 506 the frequency of the amplified signal using a mixer 228.

The wireless device may then convert 508 the analog signal to a digital signal using an analog to digital converter 112. Nonlinear distortion may be reduced 510 in the digital signal using digital post distortion reduction to obtain an output signal. The output signal may then be demodulated 512 using a demodulator.

Figure 5:
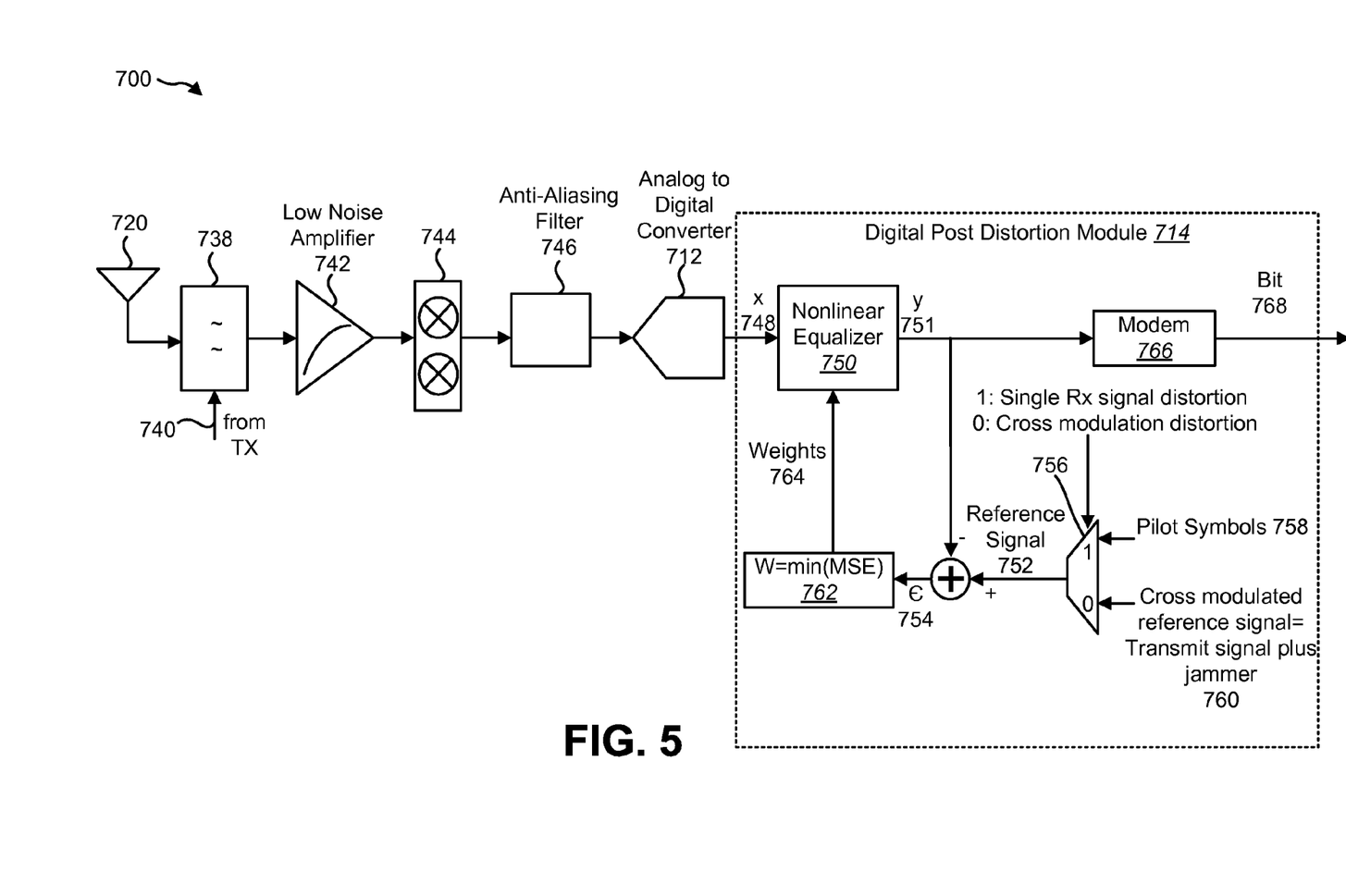
FIG. 5 is a block diagram illustrating an adaptive digital post distortion reduction scheme.

FIG. 5 is a block diagram illustrating an adaptive digital post distortion reduction scheme 700. Digital post distortion reduction may be performed within the Rx chain 216 of a wireless device. A received signal may be received by an antenna 720. The received signal may be corrupted by a leaked transmit signal 740 from the transmitter through duplexer 738 finite rejection. The corrupted signal may then be passed through a low noise amplifier (LNA) 742. The output of the low noise amplifier 742 may pass through a frequency conversion module 744. The frequency conversion module 744 may change the frequency of the signal. In one configuration, the frequency conversion module 744 may include two mixers for I/Q frequency downconversion. The zero IF configuration used in FIG. 5 may also be used in a superheterodyne type of receiver.

The output of the frequency conversion module 744 may be filtered. For example, the output of the frequency conversion module 744 may be filtered using an anti-aliasing filter (AAF) 746. The filtered signal may then be converted from an analog signal to a digital signal x 748 using an analog to digital converter 712. The digital signal x 748 may be input into a digital post distortion module 714. The digital post distortion 714 module of FIG. 5 may be one configuration of the digital post distortion modules 114 of FIG. 1. The digital post distortion module 714 may have two operating modes. In a first operating mode (Mode 0), the digital post distortion module 714 may be used to reduce receiver 210 nonlinearities due to cross modulation distortion. In a second operating mode (Mode 1), the digital post distortion module 714 may be used to reduce nonlinearities due to single Rx signal distortion. An operating mode may be selected based on the received signal strength indicator (RSSI), the most-significant-bit (MSB) of the ADC 712 output, a jammer detector flag, the Tx power level, or Tx sensing. As an example, the multiplexing switch 756 may be set to 0 if a strong jammer has been detected at the antenna connecter by jammer detector circuitry and the Tx power level is above a threshold. If these conditions are not met, the switch in the multiplexer 756 may be set to 1.

The digital post distortion module 714 may include an equalizer 750. The equalizer 750 may be a Volterra based equalizer 750. In a Volterra based equalizer 750, a model for nonlinear behavior may be used to approximate the nonlinear response. The equalizer 750 may be based on a reduced Volterra series. A reduced Volterra series is a simplified version of the Volterra series expansion that retains only a subset of the coefficients. The equalizer 750 may reduce receiver 210 nonlinearities and memory effects. The equalizer 750 may receive the digital signal 748. The equalizer 750 may then apply a weight 764 to the digital signal 748 to obtain a transformation signal y 751. The transformation signal y 751 may include the transformation of the digital signal x 748. The transformation signal y 751 may be a function of the pilot signal. The weights 764 may be loaded in the taps of the adaptive nonlinear equalizer 750. The nonlinear equalizer 750 may decrease the error vector magnitude (EVM).

As part of training the digital post distortion module 714, the transformation signal y 751 may be subtracted from a reference signal 752 using an adder to obtain an error signals ϵ 754. The reference signal 752 may be the output of a multiplexer 756. Control of the mode of the digital post distortion module 714 may be achieved through control of the multiplexer 756. The multiplexer 756 may operate in a first mode (Mode 0) to reduce receiver nonlinearities due to cross modulation distortion if an adjacent jammer is detected. The multiplexer 756 may operate in a second mode (Mode 1) to reduce for receiver 210 nonlinearities due to single and high power Rx signal distortion. The reference signal 752 used for training may be selected according to the nonlinear effect to be corrected.

In the first mode (switch 0), the multiplexer 756 may pass a cross modulation reference signal 760 as the reference signal 752. The cross modulation reference signal 760 may be a composite signal: the transmit signal sent by a transmitter on the wireless device plus an estimated jammer The training of the digital post distortion module 714 may thus be based on the composite signal during the first mode.

In the second mode, the multiplexer 756 may pass pilot symbols 758 as the reference signal 752. The pilot symbols 758 may be available on the downlink 108 of 3G/4G systems. The training of the digital post distortion module 714 may thus be based on the available pilot symbols 758. The multiplexer 756 may switch between the first mode and the second mode based on a jammer detector. Alternatively, the multiplexer 756 may switch between the first mode and the second mode based on the Tx power level.

The error signals ϵ 754 may then be used to calculate 762 the weights 764. The weights 764 may be calculated 762 using an iterative process (algorithm) which minimizes the mean square error (MSE). The algorithm used for the minimization of the MSE may be the least mean square (LMS), the recursive least square (RLS), or the least squares (LS). The minimum MSE solution may then be applied to the digital signal x 748. Once training of the equalizer 750 has finished, distortion products may be offset or reduced within the transformation signal y 751. The transformation signal y 751 may then be input into a modem 766. The modem 766 may demodulate, decode and estimate information bits 768. Each time a new pilot arrives, the weights 764 applied to the equalizer 750 may be adjusted/reiterated. The training for cross modulation reduction may occur whenever the receiver is not actively receiving a signal at the antenna. For example, the training for cross modulation reduction may occur during calibration or discontinuous reception.

Figure 6:
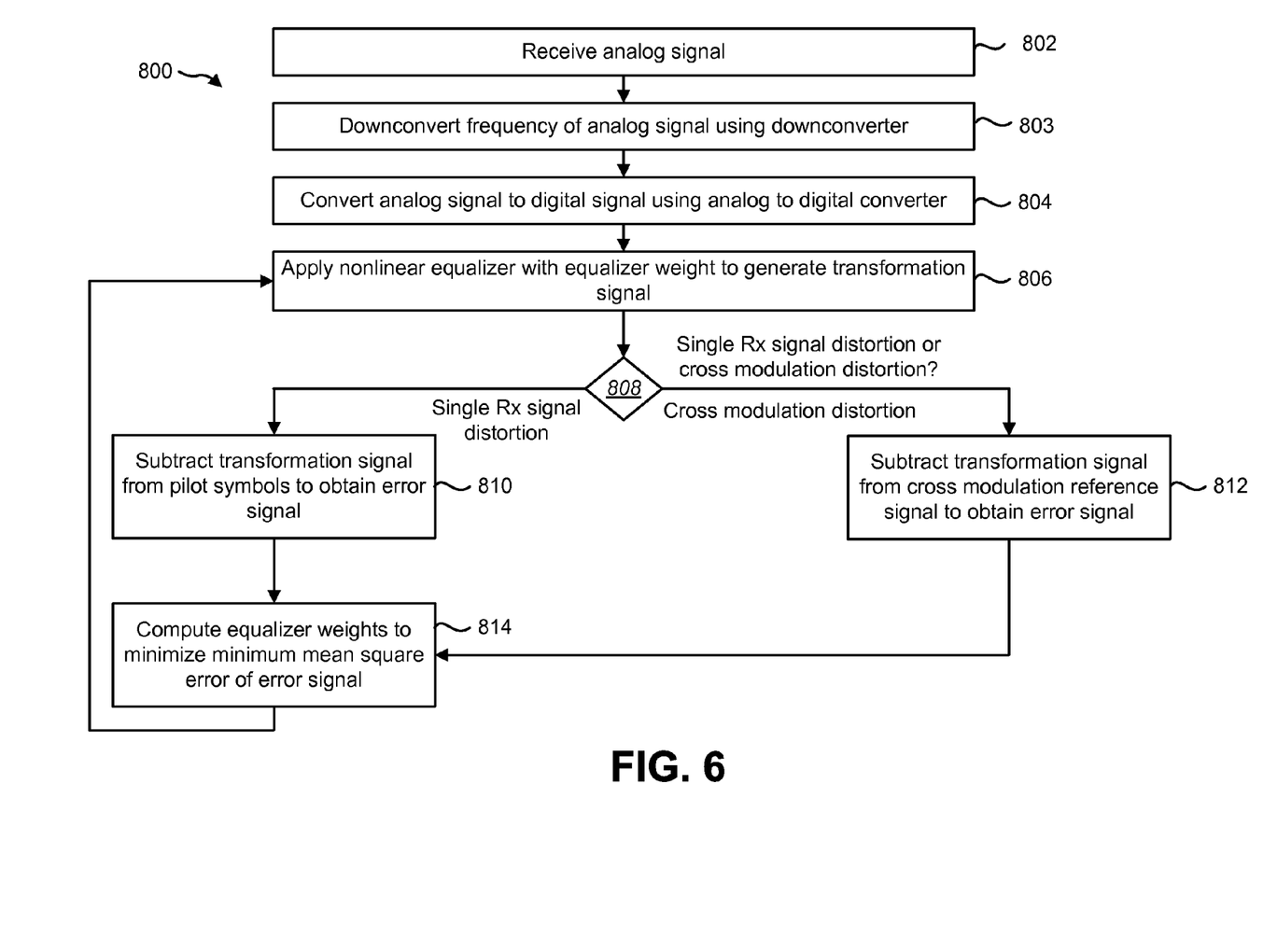
FIG. 6 is a flow diagram of a method for training a nonlinear equalizer within a digital post distortion module.

FIG. 6 is a flow diagram of a method 800 for training a nonlinear equalizer 750 within a digital post distortion module 714. The method 800 may be performed by a digital post distortion module 714 on a wireless device. The wireless device may receive 802 an analog signal. A downconverter 111 may downconvert 803 the frequency of the analog signal. An analog to digital converter 712 may convert 804 the received analog signal to a digital signal 748. The digital post distortion module 714 may apply 806 a nonlinear equalizer 750 to the digital signal 748. In one configuration, the nonlinear equalizer 750 may be a Volterra based equalizer 750. Alternatively, the equalizer 750 may be based on other polynomial expansions. The nonlinear equalizer 750 may include an adaptive filter capable of correcting instantaneous nonlinearities within the received signal.

During training, the equalizer 750 may generate a transformation signal 751. The digital post distortion module 714 may determine 808 whether to correct for single Rx signal distortion or cross modulation distortion. If single Rx signal distortion is selected, the digital post distortion module 714 may subtract 810 the transformation signal 751 from pilot symbols 758 to obtain an error signal 754. The digital post distortion module 714 may then compute 814 new equalizer 750 weights 764 in a recursive fashion using algorithms such as LMS, RLS and LS to minimize the mean square error of the error signal 754.

If cross modulation distortion is selected, the digital post distortion module 714 may subtract 812 the transformation signal 751 from a cross modulation reference signal 760 to obtain the error signal 754. The digital post distortion module 714 may then iteratively compute 814 new weights 764 to minimize the mean square error of the error signal 754. Once the recursive algorithm has converged, the training process is ended and the computed weights 764 are applied to the nonlinear equalizer 750.

Figure 7:
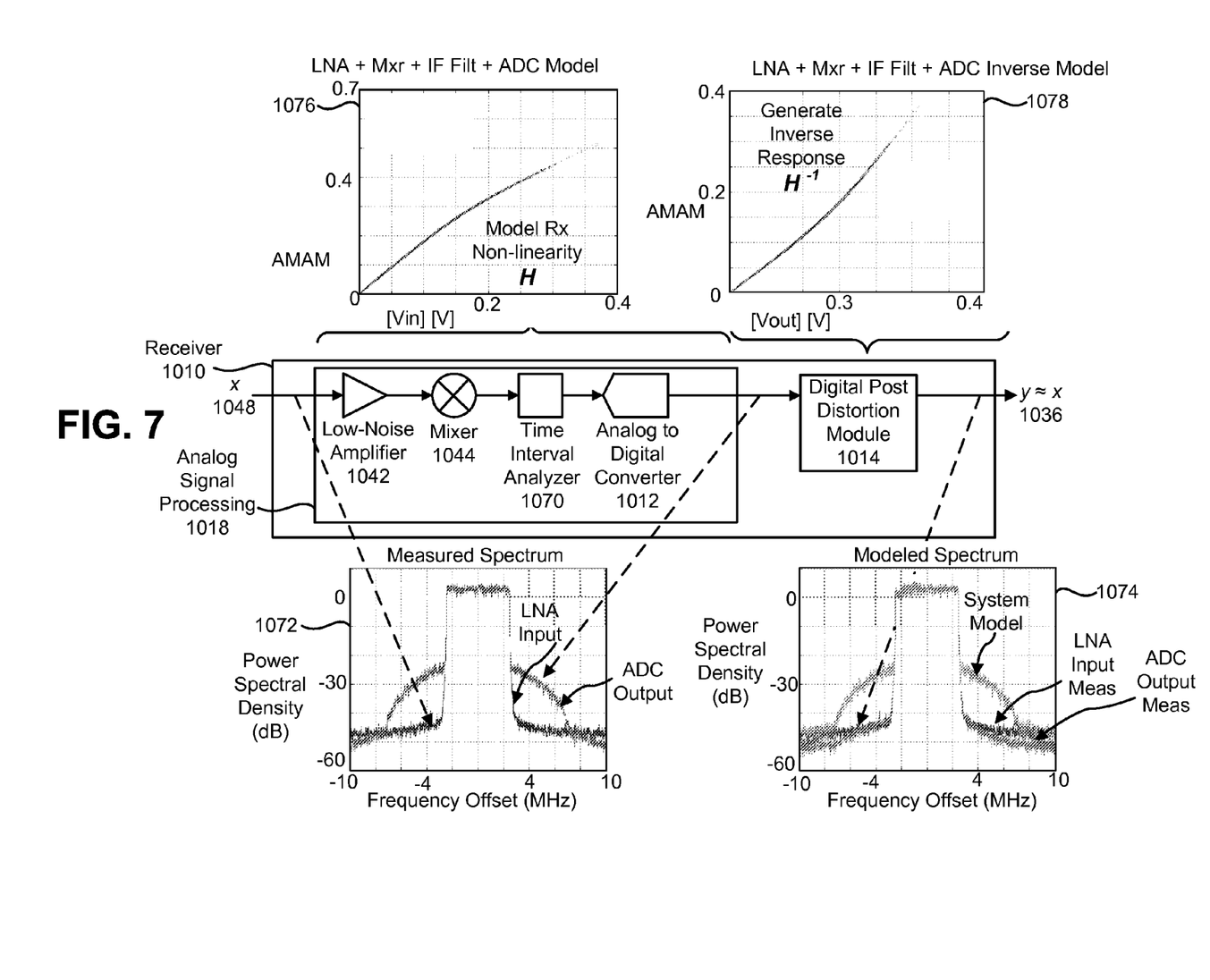
FIG. 7 is a block diagram illustrating data flows in a receiver using adaptive nonlinear digital signal processing (DSP) methods to linearize the receiver.

FIG. 7 is a block diagram illustrating data flows in a receiver 1010 using adaptive nonlinear digital signal processing (DSP) methods to linearize the receiver 1010. The receiver 1010 may receive an input signal x 1048. The input signal x 1048 may be an analog RF signal. The receiver 1010 may then apply analog signal processing 1018 to the input signal 1048. For example, the receiver 1010 may amplify the input signal 1048 using a low noise amplifier 1042, downconvert the frequency of the input signal 1048 using a mixer 1044, analyze the input signal 1048 using a time interval analyzer (TIA) 1070, and convert the input signal 1048 from an analog signal to a digital signal using an analog to digital converter 1012. The first graph 1072 illustrates the power spectrum density (dB) versus frequency offset (MHz) for the input signal 1048 prior to the analog signal processing 1018 and for the digital signal output from the ADC 1012. The analog processing 1018 may produce nonlinearities in the signal.

The output of the ADC 1012 may be input into a digital post distortion module 1014. The digital post distortion module 1014 of FIG. 7 may be one configuration of the digital post distortion modules 114 of FIG. 1. The digital post distortion module 1014 may use DSP to reduce nonlinearities in the digital signal. The second graph 1074 illustrates the power spectrum density (dB) versus the frequency offset (MHz) of the input signal 1048, the output of the ADC 1012, a system model, and the output 1036 of the digital post distortion module 1014. From the graph 1074, it may be observed that the nonlinearities introduced into the signal during the analog signal processing 1018 have been reduced in the output 1036 of the digital post distortion module 1014.

The third graph 1076 illustrates the model Rx nonlinearity H of the analog signal processing 1018 as the voltage Vin versus the amplitude to amplitude distortion (AMAM). As an example of the outcome of the proposed scheme, the generated inverse response $H^{-1}$ is illustrated in the fourth graph 1078 as the voltage Vout versus the AMAM. A dynamic deviation reduction (DDR)-based Volterra model approach may be used to represent the inverse response $H^{-1}$. DDR may lower the model-order complexity of a general Volterra series. The new Volterra series may be represented using Equation (1):

$$y(n) = \sum_{p=1}^{P} h_{p,0}(0, \ldots, )x^p(n) + \sum_{p=1}^{P}\left\{\sum_{r=1}^{P}\left[x^{p-r}(n)\right.\right.$$

$$\left.\left.\sum_{i_1=1}^{M} \ldots \sum_{i_r=i_{r-1}}^{M} h_{p,r}(0, \ldots, 0, i_1, \ldots, i_r)\prod_{j=1}^{r} x(n-i_j)\right]\right\}.$$

In Equation (1), h represents kernels of the Volterra expansion, x is the input signal, y is the output signal, p is the polynomial order and M is the memory. Because dominant amplifier nonlinearities are typically low-order and static, the high-order amplifier dynamics can be removed from the model. Thus, $H^{-1}$ may be expressed using Equation (2):

$$\tilde{u}(n) = \sum_{k=0}^{\frac{P-1}{2}} \sum_{i=0}^{M} \tilde{g}_{2k+1,1}(i)|\tilde{x}(n)|^{2k}\tilde{x}(n-i) + \sum_{k=1}^{\frac{P-1}{2}} \sum_{i=1}^{M} \tilde{g}_{2k+1,2}(i)|\tilde{x}(n)|^{2(k-1)}\tilde{x}^2(n)\tilde{x}^*(n-i). \quad (2)$$

The distorted waveform may be expressed as a linear combination (through the g coefficient) of nonlinear functions of the input signal x(n) and its delayed replica x(n−i). The inverse response $H^{-1}$ may thus act to reduce the Rx nonlinearities. The inverse response $H^{-1}$ may model each of the components of the analog signal processing 1018 to determine the overall nonlinearity. Thus, the digital post distortion module 1014 may provide reduction for all of the nonlinearities introduced within the analog signal processing 1018 using only a single digital post distortion module 1014.

The digital post distortion module 1014 may alleviate the analog receiver design, allowing for distortion. The digital post distortion module 1014 may then reduce these nonlinearities and memory effects after the ADC 1012. The gains using digital post distortion reduction may translate to lower $2^{nd}$ order intermodulation products (IM2), lower $3^{rd}$ order intermodulation products (IM3), lower DC power, and the capability to accommodate next generation Rx requirements. IM2 and IM3 may directly impact receiver 1010 design and performance. For example, the digital post distortion module 1014 may improve the IM3 performance by 15 dB-25 dB.

Figure 8:
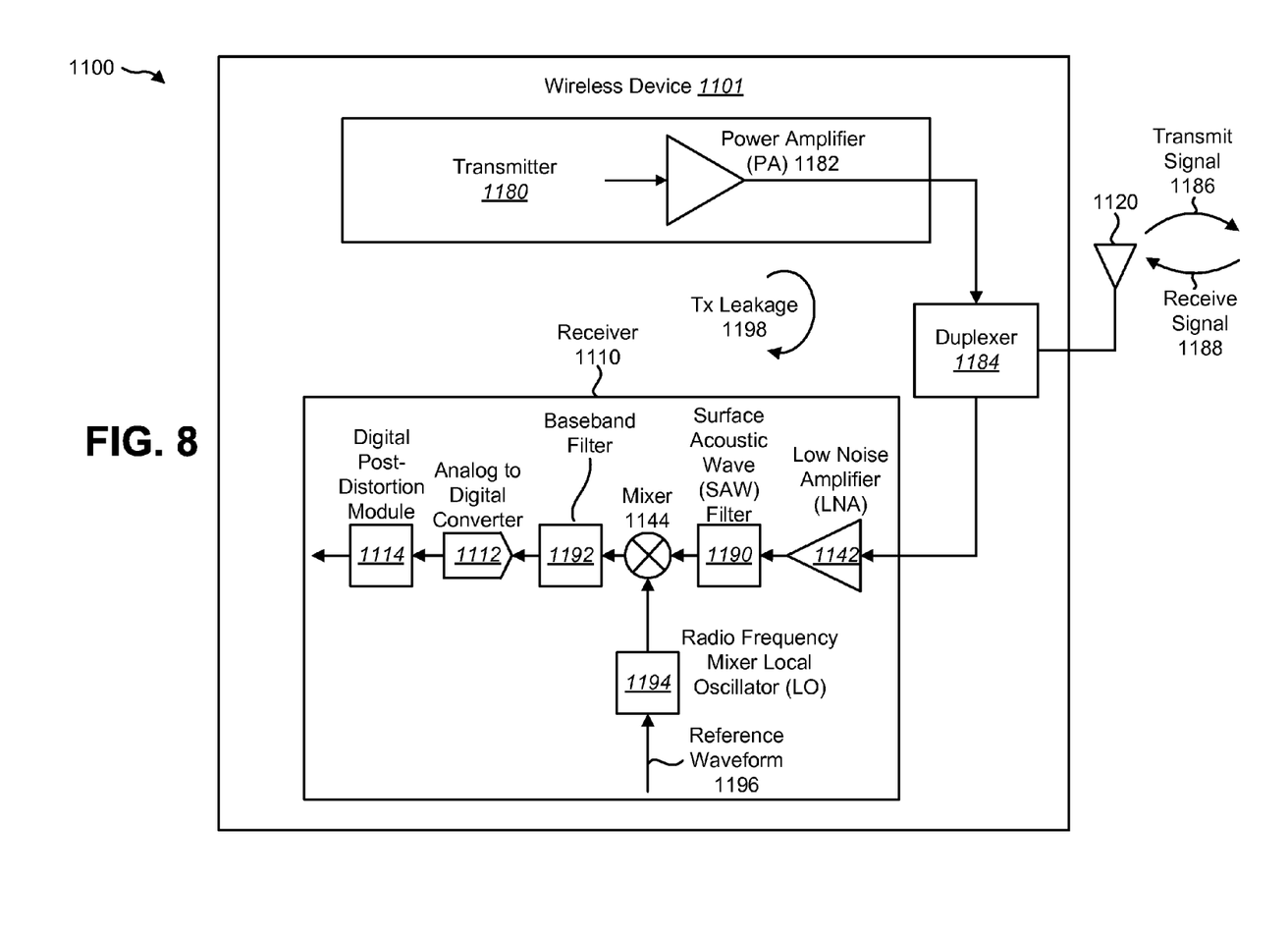
FIG. 8 is a block diagram illustrating a wireless communication system with a wireless device.

FIG. 8 is a block diagram illustrating a wireless communication system 1100 with a wireless device 1101. The wireless device 1101 may be a wireless communication device 104 or a base station 102. The wireless device 1101 may operate in a wireless full-duplex communication system 1100. A wireless device 1101 in a wireless full-duplex communication system 1100 can simultaneously transmit and receive data for two-way communications. One such full-duplex system is a CDMA system. Information to be transmitted may be supplied to a transmitter 1180 as part of a "transmit chain." An RF modulated signal may be amplified using a power amplifier 1182 to obtain a transmit signal having the proper signal level. The transmit signal is routed via a duplexer 1184 and transmitted 1186 from an antenna 1120.

On the receive path, a receiver 1110 within the wireless device 1101 may receive a signal 1188 via the antenna 1120 and duplexer 1184. The received signal may include Tx leakage 1198. In one configuration, the Tx leakage 1198 may cause distortion on the received signal. Nonlinear distortion in the receiver 1110 may cause IM2/IM3 products that directly impact receiver 1110 design and performance. The receiver 1110 may amplify the received signal using a low noise amplifier 1142. A surface acoustic wave (SAW) filter 1190 may be added to the Rx chain.

The receiver 1110 may next downconvert the frequency of the received signal using an RF mixer 1144. A reference waveform 1196 may be added to an RF mixer local oscillator (LO) 1194 using low frequency modulation to give an internal radio reference from the mixer 1144 to the ADC 1112 output.

The additional reference waveform 1196 added to the RF mixer LO 1194 may be removed prior to demodulation. A baseband filter 1192 may also be applied to the received signal. The received signal may then be converted from an analog signal to a digital signal using an analog to digital converter 1112. Digital signal processing may be performed on the digital signal by a digital post distortion module 1114. The digital post distortion module 1114 may offset/reduce distortion products.

The potential gains of digital post distortion reduction include IM3=3=3*Pin−2*IP3 (IP3 refers to the third order intercept point). For RF, a general rule is that IP3=P1 (dB) (P1 refers to the 1 dB compression point)+Constant. 6 dB better than IM3 may be equivalent to 3 dB better than IP3. Thus, a 3 dB increase in P1 (dB) is approximately twice the power. Or, for every 6 dB of improvement in the IM3, an amplifier may be run at half the current.

Figure 9:
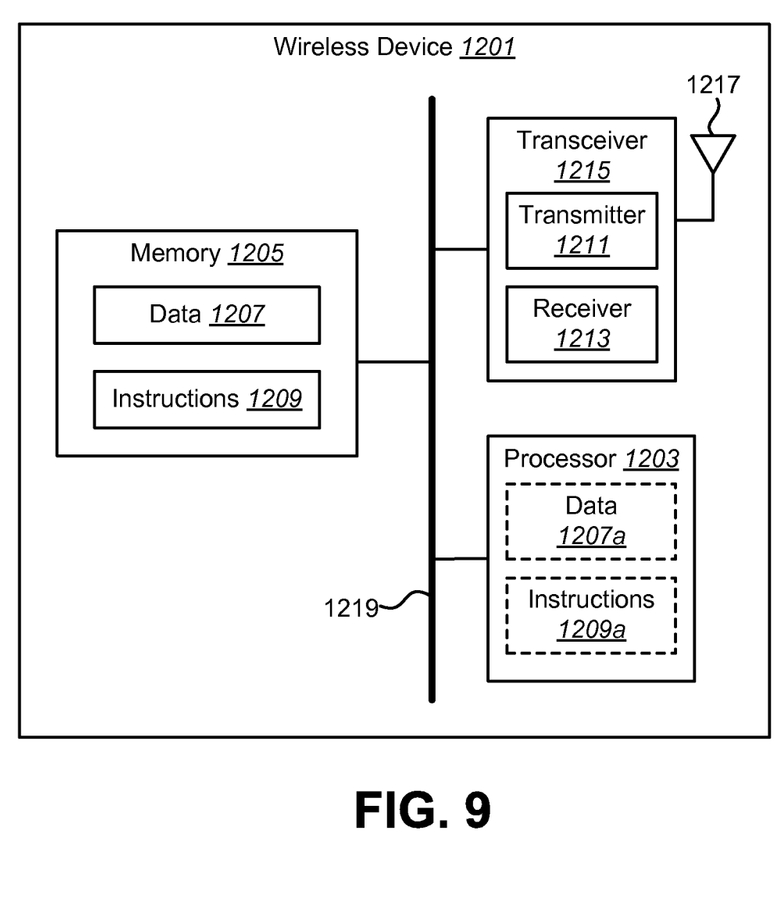
FIG. 9 illustrates certain components that may be included within a wireless device that is configured in accordance with the present disclosure.

FIG. 9 illustrates certain components that may be included within a wireless device 1201. The wireless device 1201 may be a wireless communication device 102 or a base station.

The wireless device 1201 includes a processor 1203. The processor 1203 may be a general purpose single- or multi-chip microprocessor (e.g., an ARM), a special purpose microprocessor (e.g., a digital signal processor (DSP)), a microcontroller, a programmable gate array, etc. The processor 1203 may be referred to as a central processing unit (CPU). Although just a single processor 1203 is shown in the wireless device 1201 of FIG. 9, in an alternative configuration, a combination of processors (e.g., an ARM and DSP) could be used.

The wireless device 1201 also includes memory 1205. The memory 1205 may be any electronic component capable of storing electronic information. The memory 1205 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1207 and instructions 1209 may be stored in the memory 1205. The instructions 1209 may be executable by the processor 1203 to implement the methods disclosed herein. Executing the instructions 1209 may involve the use of the data 1207 that is stored in the memory 1205. When the processor 1203 executes the instructions 1209, various portions of the instructions 1209a may be loaded onto the processor 1203, and various pieces of data 1207a may be loaded onto the processor 1203.

The wireless device 1201 may also include a transmitter 1211 and a receiver 1213 to allow transmission and reception of signals to and from the wireless device 1201. The transmitter 1211 and receiver 1213 may be collectively referred to as a transceiver 1215. An antenna 1217 may be electrically coupled to the transceiver 1215. The wireless device 1201 may also include (not shown) multiple transmitters, multiple receivers, multiple transceivers and/or multiple antenna.

The various components of the wireless device 1201 may be coupled together by one or more buses, which may include a power bus, a control signal bus, a status signal bus, a data bus, etc. For the sake of clarity, the various buses are illustrated in FIG. 9 as a bus system 1219.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC- FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 3, 4 and 6, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for adaptive digital post distortion reduction, the method comprising:
   receiving an analog radio frequency (RF) signal;
   downconverting a frequency of the analog RF signal using analog circuitry to generate a downconverted analog RF signal;
   converting the downconverted analog RF signal to a digital signal using an analog to digital converter (ADC);
   training a nonlinear equalizer based on an error signal by subtracting a transformation signal output of the nonlinear equalizer from a reference signal output of a multiplexer to generate the error signal; and
   in response to training the nonlinear equalizer, applying digital post distortion reduction to the digital signal using the nonlinear equalizer to reduce nonlinearity associated with the digital signal, wherein the nonlinear equalizer is based on an adaptive Volterra filter, a polynomial expansion, or a combination thereof.

2. The method of claim 1, wherein the transformation signal is associated with a pilot signal, and wherein the reference signal includes the pilot signal.

3. The method of claim 1, wherein the adaptive Volterra filter, the polynomial expansion, or the combination thereof, include coefficients of the nonlinear equalizer, the coefficients based on the nonlinearity associated with the digital signal.

4. The method of claim 1, further comprising amplifying the analog RF signal using a low noise amplifier (LNA).

5. The method of claim 1, wherein the digital post distortion reduction is applied prior to demodulating the digital signal.

6. The method of claim 1, wherein applying the digital post distortion reduction to the digital signal generates an output signal of the nonlinear equalizer, and further comprising inputting the output signal of the nonlinear equalizer to a modem, wherein the modem demodulates, decodes, and estimates information bits of the output signal.

7. The method of claim 1, wherein training the nonlinear equalizer further comprises:
applying a set of weights of the nonlinear equalizer to the digital signal to generate the transformation signal and iteratively training the nonlinear equalizer until the error signal converges based on a minimum mean square error of the error signal as a cost function.

8. The method of claim 1, wherein the multiplexer is associated with a first mode of operation to reduce cross modulation distortion, and wherein the reference signal is a composite signal comprising a transmit signal (Tx) and an estimated jammer.

9. The method of claim 1, wherein the multiplexer is associated with a second mode of operation to reduce single receive signal (Rx) signal distortion, and wherein the reference signal comprises pilot symbols.

10. The method of claim 1, wherein the multiplexer operates in either a first mode or a second mode, and wherein the multiplexer switches between the first mode and the second mode based on a jammer detector.

11. The method of claim 1, wherein the multiplexer operates in either a first mode or a second mode, and wherein the multiplexer switches between the first mode and the second mode based on a transmit signal (Tx) power level.

12. The method of claim 7, further comprising adjusting the set of weights in response to receiving a second pilot signal.

13. The method of claim 1, wherein reducing the nonlinearity reduces a second order inter-modulation product associated with the digital signal, a third order inter-modulation product associated with the digital signal, or any combination thereof.

14. A wireless device comprising:
circuitry configured to receive an analog radio frequency (RF) signal;
circuitry configured to downconvert a frequency of the analog RF signal to generate a downconverted analog RF signal;
circuitry configured to convert the downconverted analog RF signal to a digital signal; and
circuitry configured to apply digital post distortion reduction to the digital signal to reduce nonlinearities in the digital signal, wherein the circuitry configured to apply the digital post distortion reduction includes:
a nonlinear equalizer configured to generate a transformation signal based on the digital signal;
a multiplexer configured to output a reference signal; and
circuitry configured to train the nonlinear equalizer based on an error signal by subtracting the transformation signal from the reference signal to generate the error signal.

15. The wireless device of claim 14, further comprising a low noise amplifier (LNA) to amplify the analog RF signal.

16. The wireless device of claim 14, wherein the circuitry configured to downconvert the frequency of the analog RF signal comprises a mixer.

17. The wireless device of claim 14, wherein the circuitry configured to convert the analog RF signal to the digital signal comprises an analog to digital converter (ADC).

18. The wireless device of claim 14, wherein the digital post distortion reduction is applied prior to demodulating the digital signal.

19. The wireless device of claim 14, wherein the nonlinear equalizer is based on an adaptive Volterra filter, a polynomial expansion, or a combination thereof.

20. The wireless device of claim 14, further comprising a modem responsive to an output signal of the nonlinear equalizer, wherein the modem demodulates, decodes and estimates information bits of the output signal.

21. The wireless device of claim 14, wherein the circuitry configured to train the nonlinear equalizer is further configured to iteratively train the nonlinear equalizer until a convergence of the error signal is achieved using a minimum mean square error of the error signal as a cost function.

22. The wireless device of claim 14, wherein the nonlinear equalizer is further configured to apply a set of weights to the digital signal to generate the transformation signal.

23. The wireless device of claim 22, further comprising circuitry configured to adjust the set of weights in response to receiving a second pilot signal.

24. The wireless device of claim 14, wherein the multiplexer is further configured to operate in a first mode to reduce cross modulation distortion, and wherein in the first mode the reference signal is a composite signal comprising a transmit signal (Tx) and an estimated jammer.

25. The wireless device of claim 24, wherein the multiplexer is further configured to operate in a second mode to reduce single receive signal (Rx) signal distortion, and wherein in the second mode the reference signal comprises pilot symbols.

26. The wireless device of claim 25, wherein the multiplexer is further configured to switch between the first mode and the second mode based on a jammer detector.

27. The wireless device of claim 25, wherein the multiplexer is further configured to switch between the first mode and the second mode based on a transmit signal (Tx) power level.

28. A wireless device configured for adaptive digital post distortion reduction, the wireless device comprising:
means for receiving an analog radio frequency (RF) signal;
means for downconverting a frequency of the analog RF signal using analog circuitry to generate a downconverted analog RF signal;
means for converting the analog downconverted RF signal to a digital signal using an analog to digital converter (ADC); and
means for applying digital post distortion reduction to the digital signal to reduce nonlinearities in the digital signal, wherein the means for applying the post distortion reduction includes:
means for applying nonlinear equalization to the digital signal to generate a transformation signal;
means for selecting a reference signal; and
means for training the nonlinear equalizer based on an error signal by subtracting the transformation signal from the reference signal to generate the error signal.

29. The wireless device of claim 28, wherein the means for selecting the reference signal comprises a multiplexer, and wherein the means for applying the digital post distortion reduction comprises dedicated specific hardware.

30. The wireless device of claim 28, wherein the means for applying the digital post distortion reduction comprises a digital signal processor (DSP).

31. The wireless device of claim 28, wherein the means for training the nonlinear equalizer is configured to iteratively train the means for applying the nonlinear equalization until a convergence of the error signal is enabled based on a minimum mean square error of the error signal as a cost function.

32. A non-transitory computer-readable medium comprising instructions that, when executed by a processor, cause the processor to:
receive an analog radio frequency (RF) signal;
downconvert a frequency of the analog RF signal using analog circuitry to generate a downconverted analog RF signal;
convert the downconverted analog RF signal to a digital signal using an analog to digital converter (ADC);
train a nonlinear equalizer based on an error signal by subtracting a transformation signal output of the nonlinear equalizer from a reference signal output of a multiplexer to generate the error signal; and
in response to training the nonlinear equalizer, apply digital post distortion reduction to the digital signal using the nonlinear equalizer to reduce nonlinearity associated with the digital signal, wherein the nonlinear equalizer is based on an adaptive Volterra filter, a polynomial expansion, or a combination thereof.

33. The non-transitory computer-readable medium of claim 32, wherein the instructions are further executable by the processor to cause the processor to:
apply a set of weights of the nonlinear equalizer to the digital signal to generate the transformation signal; and
iteratively repeat training the nonlinear equalizer until a convergence of the error signal is enabled based on a minimum mean square error of the error signal as a cost function.

* * * * *